United States Patent
In et al.

(10) Patent No.: US 9,886,891 B2
(45) Date of Patent: Feb. 6, 2018

(54) SENSING DRIVING CIRCUIT AND DISPLAY DEVICE INCLUDING THE SAME

(71) Applicant: Samsung Display Co., Ltd., Yongin, Gyeonggi-Do (KR)

(72) Inventors: Hai-Jung In, Seoul (KR); Bo-Yong Chung, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 169 days.

(21) Appl. No.: 14/728,843

(22) Filed: Jun. 2, 2015

(65) Prior Publication Data

US 2016/0217728 A1 Jul. 28, 2016

(30) Foreign Application Priority Data

Jan. 26, 2015 (KR) ........................ 10-2015-0011835

(51) Int. Cl.
*G09G 3/36* (2006.01)
*G09G 3/20* (2006.01)
(Continued)

(52) U.S. Cl.
CPC ......... *G09G 3/2096* (2013.01); *G09G 3/3225* (2013.01); *G09G 3/3266* (2013.01); *G09G 3/3275* (2013.01); *G11C 19/184* (2013.01); *G11C 19/188* (2013.01); *G09G 2300/0819* (2013.01); *G09G 2310/0205* (2013.01);
(Continued)

(58) Field of Classification Search
CPC .. G09G 3/2096; G09G 3/3275; G09G 3/3266; G09G 3/3225; G09G 2310/0291; G09G 2320/045; G09G 2310/0294; G09G 2330/12; G09G 2300/0819;
(Continued)

(56) References Cited

U.S. PATENT DOCUMENTS

2007/0086558 A1* 4/2007 Wei ........................ G11C 19/28
377/64
2008/0013670 A1 1/2008 Lo et al.
(Continued)

FOREIGN PATENT DOCUMENTS

KR 10-2007-0022550 A 2/2007
KR 10-2007-0055817 A 5/2007
(Continued)

*Primary Examiner* — Ibrahim Khan
(74) *Attorney, Agent, or Firm* — Knobbe Martens Olson & Bear, LLP

(57) ABSTRACT

A sensing driving circuit and a display device including the same are disclosed. In one aspect, the sensing driving circuit includes a plurality of stages configured to respectively output a plurality of sensing signals and including a (K)th stage and a (K+1)th stage. The (K)th stage includes a shift register configured to provide a (K)th carry signal to the (K+1)th stage; and a masking buffer configured to output a (K)th sensing signal. The masking buffer includes a first input circuit configured to provide i) an input signal to a first node based on a node driving signal and ii) a first power voltage to a second node based on the input signal and the node driving signal. The masking buffer also includes a node masking circuit configured to supply the first power voltage to the first node based on a masking signal.

20 Claims, 11 Drawing Sheets

(51) Int. Cl.
  *G09G 3/3225* (2016.01)
  *G09G 3/3266* (2016.01)
  *G09G 3/3275* (2016.01)
  *G11C 19/18* (2006.01)
(52) U.S. Cl.
  CPC ............... *G09G 2310/0216* (2013.01); *G09G 2310/0251* (2013.01); *G09G 2310/0286* (2013.01); *G09G 2310/0291* (2013.01); *G09G 2310/0294* (2013.01); *G09G 2310/061* (2013.01); *G09G 2320/043* (2013.01); *G09G 2320/045* (2013.01); *G09G 2330/12* (2013.01)
(58) Field of Classification Search
  CPC ... G09G 2310/0205; G09G 2310/0216; G11C 19/184; G11C 19/188
  See application file for complete search history.

(56) References Cited

U.S. PATENT DOCUMENTS

| | | | |
|---|---|---|---|
| 2008/0170011 A1 | 7/2008 | Kohno et al. | |
| 2010/0109996 A1* | 5/2010 | Park | G09G 3/3677 345/100 |
| 2011/0041020 A1* | 2/2011 | Liu | G01R 31/318536 714/731 |
| 2011/0102389 A1* | 5/2011 | Park | G06F 3/0412 345/205 |
| 2013/0222352 A1* | 8/2013 | Jeong | G09G 3/3266 345/205 |
| 2013/0235025 A1 | 9/2013 | Kitayama et al. | |
| 2014/0086379 A1* | 3/2014 | Ma | G11C 19/28 377/64 |
| 2014/0091997 A1 | 4/2014 | Han et al. | |
| 2015/0009204 A1 | 1/2015 | Chaji | |
| 2015/0295565 A1* | 10/2015 | Maeda | G11C 19/28 345/214 |
| 2016/0253938 A1* | 9/2016 | Yu | G09G 3/3674 345/214 |
| 2016/0351156 A1* | 12/2016 | Wu | G11C 19/28 |

FOREIGN PATENT DOCUMENTS

| | | |
|---|---|---|
| KR | 10-2007-0120828 A | 12/2007 |
| KR | 10-2014-0028999 A | 3/2014 |
| KR | 10-2014-0057794 A | 5/2014 |

* cited by examiner

ROW LINE

US 9,886,891 B2

SENSING DRIVING CIRCUIT AND DISPLAY DEVICE INCLUDING THE SAME

INCORPORATION BY REFERENCE TO ANY PRIORITY APPLICATIONS

This application claims priority under 35 USC § 119 to Korean Patent Applications No. 10-2015-0011835, filed on Jan. 26, 2015 in the Korean Intellectual Property Office (KIPO), the contents of which are incorporated herein in its entirety by reference.

BACKGROUND

Field

The described technology generally relates to a sensing driving circuit and a display device having the sensing driving circuit.

Description of the Related Technology

Generally, a display device includes a display panel and a driving unit. The display panel includes a plurality of scan lines, a plurality of data lines, and a plurality of pixels. The driving unit includes a scan driving circuit providing scan signals to the scan lines and a data driving circuit providing data signals to the data lines.

Pixels in a display device degrade with usage, and characteristics of the pixel such as luminance can be impacted. Various methods of sensing and measuring the change in pixel characteristics and compensating for the change are undergoing research.

SUMMARY OF CERTAIN INVENTIVE ASPECTS

One inventive aspect relates to a sensing driving circuit that can selectively output sensing signals.

Another aspect is a display device that can measure a characteristic change of a pixel.

Another aspect is a sensing driving circuit that includes a plurality of stages outputting a plurality of sensing signals, respectively. A (K)th stage of the stages can include a shift register unit configured to provide a (K)th carry signal to a next stage of the (K)th stage and a masking buffer unit configured to output a (K)th sensing signal of the sensing signals. The masking buffer unit can include a first input part configured to apply an input signal to a first node in response to a node driving signal, and to apply a first power voltage to a second node in response to the input signal and the node driving signal, a node masking part configured to apply the first power voltage to the first node in response to a masking signal, and to apply a second power voltage to the second node in response to the masking signal, a sensing pull-up part configured to pull up the (K)th sensing signal in response to a second node signal of the second node, and a sensing pull-down part configured to pull down the (K)th sensing signal in response to a first node signal of the first node, where K is an integer greater than 0.

In example embodiments, the first input part includes a first input transistor, a second input transistor, and a third input transistor. The first input transistor can include a gate electrode to which the input signal is applied, a first electrode to which the first power voltage is applied, and a second electrode connected to a first electrode of the second input transistor. The second input transistor can include a gate electrode to which the node driving signal is applied, the first electrode connected to the second electrode of the first input transistor, and a second electrode connected to the second node. The third input transistor can include a gate electrode to which the node driving signal is applied, a first electrode to which the input signal is applied, and a second electrode connected to the first node.

In example embodiments, the node masking part includes a first masking transistor and a second masking transistor. The first masking transistor can include a gate electrode to which the masking signal is applied, a first electrode to which the first power voltage applied, and a second electrode connected to the first node. The second masking transistor can include a gate electrode to which the masking signal applied, a first electrode to which a second power voltage is applied, and a second electrode connected to the second node.

In example embodiments, the sensing pull-up part includes a first full-up transistor and a first capacitor.

In example embodiments, the first full-up transistor includes a gate electrode connected to the second node, a first electrode to which the first power voltage is applied, and a second electrode connected to a sensing signal output terminal outputting the (K)th sensing signal. The first capacitor can include a first electrode connected to the second node, and a second electrode to which the first power voltage is applied.

In example embodiments, the first full-up transistor includes a gate electrode connected to the second node, a first electrode to which a simultaneous driving signal, and a second electrode connected to a sensing signal output terminal outputting the (K)th sensing signal. The first capacitor can include a first electrode connected to the second node, and a second electrode to which the simultaneous driving signal is applied.

In example embodiments, the sensing pull-down part includes a first full-down transistor, and a second capacitor. The first full-down transistor can include a gate electrode connected to the first node, a first electrode to which a first clock signal is applied, and a second electrode a sensing signal output terminal outputting the (K)th sensing signal. The second capacitor can include a first electrode connected to the first node, and a second electrode connected to the sensing signal output terminal.

In example embodiments, the shift register unit includes a second input part configured to apply the input signal to a third node in response to a second clock signal, a third input part configured to apply the second clock signal to a fourth node in response to a third node signal of the third node, a carry pull-up part configured to pull up the (K)th carry signal in response to the fourth node signal, a carry pull-down part configured to pull down the (K)th carry signal in response to the third node signal, a holding part configured to maintain the fourth node signal in response to the second clock signal, and a stabilizing part configured to stabilize the (K)th carry signal in response to the fourth node signal and a first clock signal.

In example embodiments, the second input part includes a fourth input transistor. The fourth input transistor can include a gate electrode to which the second clock signal is applied, a first electrode to which the input signal is applied, and a second electrode connected to the third node.

In example embodiments, the third input part includes a fifth input transistor. The fifth input transistor can include a gate electrode to which the third node signal is applied, a first electrode to which the second clock signal is applied, and a second electrode connected to the fourth node.

In example embodiments, the carry pull-up part includes a second pull-up transistor and a third capacitor. The second pull-up transistor can include a gate electrode connected to the fourth node, a first electrode to which the first power voltage is applied, and a second electrode connected to a carry signal output terminal outputting the (K)th carry signal. The third capacitor can include a first electrode connected to the fourth node, and a second electrode to which the first power voltage is applied.

In example embodiments, the carry pull-down part includes a second pull-down transistor and a fourth capacitor. The second pull-down transistor can include a gate electrode connected to the third node, a first electrode to which a first clock signal is applied, and a second electrode connected to a carry signal output terminal outputting the (K)th carry signal. The fourth capacitor can include a first electrode connected to the third node, and a second electrode connected to the carry signal output terminal.

In example embodiments, the holding part includes a holding transistor. The holding transistor can include a gate electrode to which the second clock signal is applied, a first electrode to which the second clock signal is applied, and a second electrode connected to the fourth node.

In example embodiments, the stabilizing part includes a first stabilizing transistor and a second stabilizing transistor. The first stabilizing transistor can include a gate electrode to which the first clock signal is applied, a first electrode connected to the third node, and a second electrode connected to a first electrode of the second stabilizing transistor. The second stabilizing transistor can include a gate electrode connected to the fourth node, the first electrode connected to the second electrode of the first stabilizing transistor, and the second electrode connected to a carry signal output terminal outputting the (K)th carry signal.

Another aspect is a display device that includes a display panel including a plurality of scan lines, a plurality of sensing lines, a plurality of data lines, and a plurality of pixels, a data driving circuit configured to output a plurality of data signals to the data lines, respectively, a scan driving circuit configured to output a plurality of scan signals to the scan lines, respectively, a sensing driving circuit including a plurality of stages outputting a plurality of sensing signals for measuring a characteristic change of the pixels to the sensing lines, respectively, and a controller configured to control the data driving circuit, the scan driving circuit, and the sensing driving circuit. A (K)th stage of the stages can include a shift register unit configured to provide a (K)th carry signal to a next stage of the (K)th stage, and a masking buffer unit configured to output a (K)th sensing signal of the sensing signals. The masking buffer unit can include a first input part configured to apply an input signal to a first node in response to a node driving signal, and to apply a first power voltage to a second node in response to the input signal and the node driving signal, a node masking part configured to apply the first power voltage to the first node in response to a masking signal, and to apply a second power voltage to the second node in response to the masking signal, a sensing pull-up part configured to pull up the (K)th sensing signal in response to a second node signal of the second node, and a sensing pull-down part configured to pull down the (K)th sensing signal in response to a first node signal of the first node, where K is an integer greater than 0.

In example embodiments, the scan driving circuit sequentially outputs the scan signals to the scan lines in a display period. The sensing driving circuit can output at least one of the sensing signals to at least one of the sensing lines in a sensing period.

In example embodiments, the controller measures a magnitude of the characteristic change for at least one of the pixels to which the sensing signals are applied in the sensing period.

In example embodiments, the controller compensates input image data based on the characteristic change to adjust the data signals.

In example embodiments, the sensing driving circuit outputs the sensing signals that have the same phase to the sensing lines in an initialization period of the display panel.

In example embodiments, the shift register unit includes a second input part configured to apply the input signal to a third node in response to a second clock signal, a third input part configured to apply the second clock signal to a fourth node in response to a third node signal of the third node, a carry pull-up part configured to pull up the (K)th carry signal in response to the fourth node signal, a carry pull-down part configured to pull down the (K)th carry signal in response to the third node signal, a holding part configured to maintain the fourth node signal in response to the second clock signal, and a stabilizing part configured to stabilize the (K)th carry signal in response to the fourth node signal and a first clock signal.

Another aspect is a sensing driving circuit for a display device, comprising: a plurality of stages configured to respectively output a plurality of sensing signals and including a (K)th stage and a (K+1)th stage. The (K)th stage comprises a shift register configured to provide a (K)th carry signal to the (K+1)th stage; and a masking buffer configured to output a (K)th sensing signal. The masking buffer includes: a first input circuit configured to provide i) an input signal to a first node based on a node driving signal and ii) a first power voltage to a second node based on the input signal and the node driving signal; a node masking circuit configured to supply the first power voltage to the first node based on a masking signal, and supply a second power voltage to the second node based on the masking signal; a sensing pull-up circuit configured to pull up the (K)th sensing signal based on a second node signal of the second node; and a sensing pull-down circuit configured to pull down the (K)th sensing signal based on a first node signal of the first node, where K is an integer greater than 0.

In the above sensing driving circuit, the first input circuit includes: a first input transistor including a gate electrode configured to receive the input signal, a first electrode configured to receive the first power voltage, and a second electrode; a second input transistor including a gate electrode configured to receive the node driving signal, a first electrode electrically connected to the second electrode of the first input transistor, and a second electrode electrically connected to the second node; and a third input transistor including a gate electrode configured to receive the node driving signal, a first electrode configured to receive the input signal, and a second electrode electrically connected to the first node.

In the above sensing driving circuit, the node masking circuit includes: a first masking transistor including a gate electrode configured to receive the masking signal, a first electrode configured to receive the first power voltage, and a second electrode electrically connected to the first node; and a second masking transistor including a gate electrode configured to receive the masking signal, a first electrode configured to receive a second power voltage, and a second electrode electrically connected to the second node.

In the above sensing driving circuit, the sensing pull-up circuit includes a first full-up transistor and a first capacitor.

In the above sensing driving circuit, the first full-up transistor includes a gate electrode electrically connected to the second node, a first electrode configured to receive the first power voltage, and a second electrode electrically connected to a sensing signal output terminal configured to output the (K)th sensing signal, wherein the first capacitor includes a first electrode electrically connected to the second node and a second electrode configured to receive the first power voltage.

In the above sensing driving circuit, the first full-up transistor includes a gate electrode electrically connected to the second node, a first electrode configured to receive a global driving signal, and a second electrode electrically connected to a sensing signal output terminal configured to output the (K)th sensing signal, wherein the first capacitor includes a first electrode electrically connected to the second node and a second electrode configured to receive the global driving signal.

In the above sensing driving circuit, the sensing pull-down circuit includes: a first full-down transistor including a gate electrode electrically connected to the first node, a first electrode configured to receive a first clock signal, and a second electrode electrically connected to a sensing signal output terminal configured to output the (K)th sensing signal; and a second capacitor including a first electrode electrically connected to the first node and a second electrode electrically connected to the sensing signal output terminal.

In the above sensing driving circuit, the shift register includes: a second input circuit configured to provide the input signal to a third node based on a second clock signal; a third input circuit configured to provide the second clock signal to a fourth node based on a third node signal of the third node; a carry pull-up circuit configured to pull up the (K)th carry signal based on the fourth node signal; a carry pull-down circuit configured to pull down the (K)th carry signal based on the third node signal; a holding circuit configured to maintain the fourth node signal based on the second clock signal; and a stabilizing circuit configured to stabilize the (K)th carry signal based on the fourth node signal and a first clock signal.

In the above sensing driving circuit, the second input circuit includes a fourth input transistor including a gate electrode configured to receive the second clock signal, a first electrode configured to receive the input signal, and a second electrode electrically connected to the third node.

In the above sensing driving circuit, the third input circuit includes a fifth input transistor including a gate electrode configured to receive the third node signal, a first electrode configured to receive the second clock signal, and a second electrode electrically connected to the fourth node.

In the above sensing driving circuit, the carry pull-up circuit includes; a second pull-up transistor including a gate electrode electrically connected to the fourth node, a first electrode configured to receive the first power voltage, and a second electrode electrically connected to a carry signal output terminal configured to output the (K)th carry signal; and a third capacitor including a first electrode electrically connected to the fourth node and a second electrode configured to receive the first power voltage.

In the above sensing driving circuit, the carry pull-down circuit includes: a second pull-down transistor including a gate electrode electrically connected to the third node, a first electrode configured to receive a first clock signal, and a second electrode electrically connected to a carry signal output terminal configured to output the (K)th carry signal; and a fourth capacitor including a first electrode electrically connected to the third node and a second electrode electrically connected to the carry signal output terminal.

In the above sensing driving circuit, the holding circuit includes a holding transistor including a gate electrode configured to receive the second clock signal, a first electrode configured to receive the second clock signal, and a second electrode electrically connected to the fourth node.

In the above sensing driving circuit, the stabilizing circuit includes: a first stabilizing transistor including a gate electrode configured to receive the first clock signal, a first electrode electrically connected to the third node, and a second electrode; and a second stabilizing transistor including a gate electrode electrically connected to the fourth node, a first electrode electrically connected to the second electrode of the first stabilizing transistor, and a second electrode electrically connected to a carry signal output terminal configured to output the (K)th carry signal.

Another aspect is a display device comprising: a display panel including a plurality of scan lines, a plurality of sensing lines, a plurality of data lines, and a plurality of pixels; a data driving circuit configured to output a plurality of data signals respectively to the data lines; a scan driving circuit configured to output a plurality of scan signals respectively to the scan lines; a sensing driving circuit including a plurality of stages each configured to output at least one of a plurality of sensing signals to at least one of the sensing lines so as to measure a change in at least one characteristic of the pixels, wherein the stages include a (K)th stage and a (K+1)th stage; and a controller configured to control the data driving circuit, the scan driving circuit, and the sensing driving circuit. The (K)th stage includes: a shift register configured to provide a (K)th carry signal to the (K+1)th stage; and a masking buffer configured to output a (K)th sensing signal. The masking buffer includes: a first input circuit configured to provide i) an input signal to a first node based on a node driving signal and ii) a first power voltage to a second node based on the input signal and the node driving signal; a node masking circuit configured to supply the first power voltage to the first node based on a masking signal, and to supply a second power voltage to the second node based on the masking signal; a sensing pull-up circuit configured to pull up the (K)th sensing signal based on a second node signal of the second node; and a sensing pull-down circuit configured to pull down the (K)th sensing signal based on a first node signal of the first node, where K is an integer greater than 0.

In the above display device, the scan driving circuit is further configured to sequentially output the scan signals to the scan lines in a display period, wherein the sensing driving circuit is further configured to provide the at least one sensing signal to the at least one sensing line in a sensing period.

In the above display device, the controller is further configured to measure a magnitude of the change in the characteristic of at least one of the pixels configured to receive the at least one sensing signal.

In the above display device, the controller is further configured to compensate input image data based on the change in the characteristic of the pixels so as to adjust the data signals.

In the above display device, the sensing driving circuit is further configured to output the sensing signals having the same phase to the sensing lines in an initialization period of the display panel.

In the above display device, the shift register includes: a second input circuit configured to provide the input signal to a third node based on a second clock signal; a third input circuit configured to provide the second clock signal to a fourth node based on a third node signal of the third node; a carry pull-up circuit configured to pull up the (K)th carry signal based on the fourth node signal; a carry pull-down circuit configured to pull down the (K)th carry signal based on the third node signal; a holding circuit configured to maintain the fourth node signal based on the second clock signal; and a stabilizing circuit configured to stabilize the (K)th carry signal based on the fourth node signal and a first clock signal.

According to at least one of the disclosed embodiments, a sensing driving circuit selectively outputs sensing signals without an additional decoder. The sensing driving circuit can have a simple structure in comparison with a driving circuit including the decoder.

In addition, a display device according to example embodiments can reduce power consumption and manufacturing cost by including the sensing driving circuit. The display device can have a narrow bezel because the sensing driving circuit is implemented in a small scale.

DETAILED DESCRIPTION OF CERTAIN INVENTIVE EMBODIMENTS

Exemplary embodiments will be described more fully hereinafter with reference to the accompanying drawings, in which various embodiments are shown. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
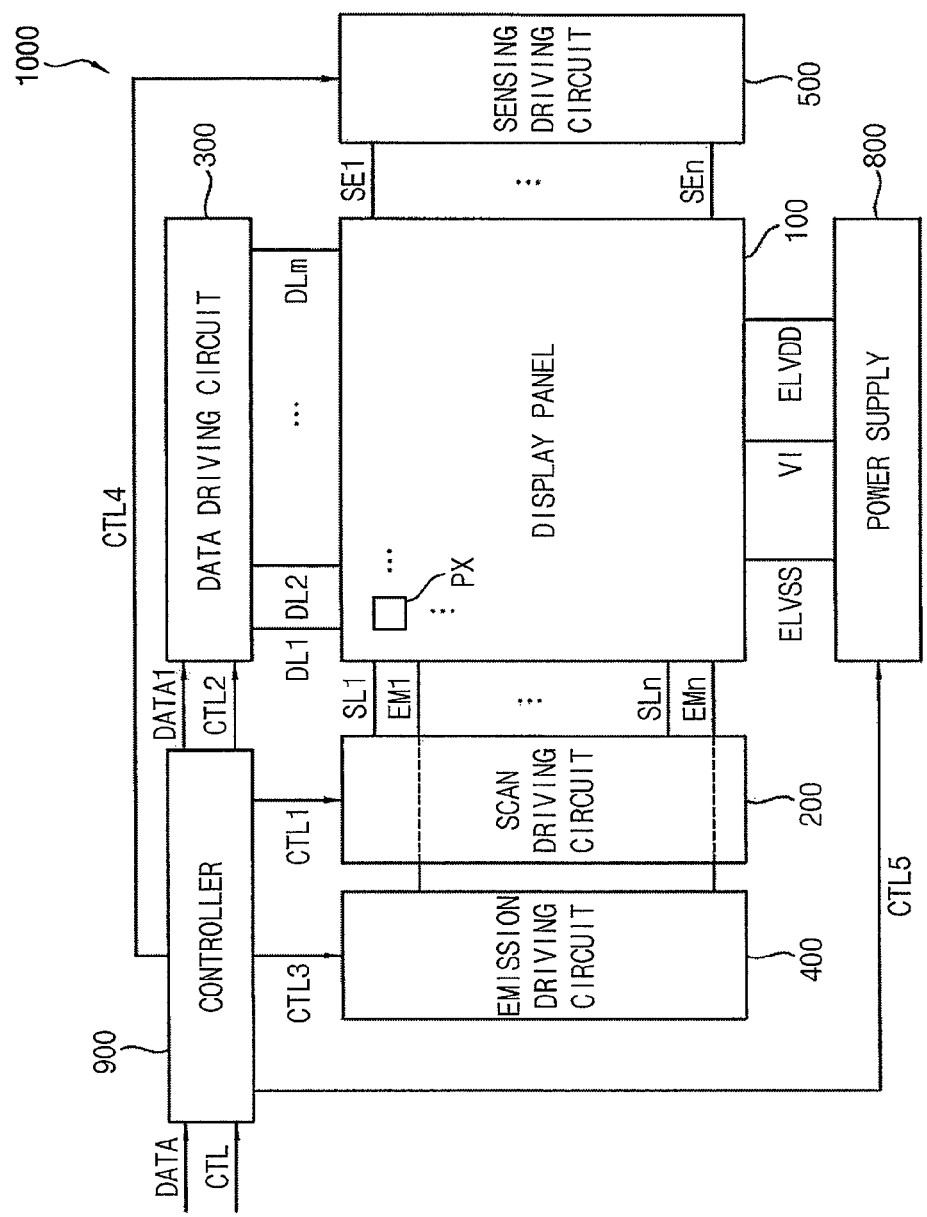
FIG. 1 is a block diagram illustrating a display device according to example embodiments.

Referring to FIG. 1, the display device 1000 includes a display panel 100, a scan driving circuit 200, a data driving circuit 300, an emission driving circuit 400, a sensing driving circuit 500, a power supply 800, and a controller 900. In some embodiments, the display device 1000 is an organic light-emitting diode (OLED) display. Depending on embodiments, certain elements may be removed from or additional elements may be added to the display device 1000 illustrated in FIG. 1. Furthermore, two or more elements may be combined into a single element, or a single element may be realized as multiple elements. This applies to the remaining apparatus embodiments.

The display panel 100 can display an image. The display panel 100 can include a plurality of scan lines SL1 through SLn, a plurality of sensing lines SE1 through SEn, a plurality of emission lines EM1 through EMn, a plurality of data lines DL1 through DLm, and a plurality of pixels PX. For example, the display panel 100 includes n*m pixels PX because the pixels PX are arranged at locations corresponding to crossing points of the scan lines SL1 through SLn and the data-lines DL1 through DLm.

The scan driving circuit 200 can provide a plurality of scan signals to the pixels PX via the scan lines SL1 through SLn based on a first control signal CONT1 received from the controller 900.

The data driving circuit 300 can provide a plurality of data signals to the pixels PX via the data lines DL1 through DLm based on a second control signal CONT2 and output image data DATA1 received from the controller 900.

The emission driving circuit 400 can provide a plurality of emission signals to the pixels PX via the emission lines EM1 through EMn based on a third control signal CONT3 received from the controller 900.

The sensing driving circuit 500 can output at least one of the sensing signals to at least one of the sensing lines SE1 through SEn in a sensing period based on a fourth control signal CONT4 received from the controller 900. The sensing driving circuit 500 can include a plurality of stages. Each of the stages can output the sensing signal to measure a characteristic change of the pixel PX. In some embodiments, the sensing driving circuit 500 outputs the sensing signals that have substantially the same phase to the sensing lines SE1 through SEn in an initialization period to initialize the display panel 100. One pixel characteristic is luminance, but is not limited thereto.

A (K)th stage included in the sensing driving circuit 500 can include a shift register unit and a masking buffer unit, where K is an integer greater than 0. The shift register unit can provide a (K)th carry signal to a next stage of the (K)th stage (e.g., the (K+1)th stage). The masking buffer unit can output a (K)th sensing signal. In some embodiments, the masking buffer unit includes a first input part or first input circuit applying an input signal to a first node in response to a node driving signal and applying a first power voltage to a second node in response to the input signal and the node driving signal, a node masking part or node masking circuit applying the first power voltage to the first node in response to a masking signal and applying a second power voltage to the second node in response to the masking signal, a sensing pull-up part or sensing pull-up circuit pulling up the (K)th sensing signal in response to a second node signal of the second node, and a sensing pull-down part or sensing pull-down circuit pulling down the (K)th sensing signal in response to a first node signal of the first node. In some embodiments, the shift register unit includes a second input part or second input circuit applying the input signal to a third node in response to a second clock signal, a third input part or third input circuit applying the second clock signal to a fourth node in response to a third node signal of the third node, a carry pull-up part or carry pull-up circuit pulling up the (K)th carry signal in response to the fourth node signal, a carry pull-down part or carry pull-down circuit pulling down the (K)th carry signal in response to the third node signal, a holding part or holding circuit maintaining the fourth node signal in response to the second clock signal, and a stabilizing part or stabilizing circuit stabilizing the (K)th carry signal in response to the fourth node signal and a first clock signal. Hereinafter, the sensing driving circuit 500 will be described in detail with reference to the FIGS. 4 through 7.

The power supply 800 can provide a high power voltage ELVDD, a low power voltage ELVSS, and an initialization voltage VI to the pixels PX via power lines.

The controller 900 can control the scan driving circuit 200, the data driving circuit 300, the emission driving circuit 400, the sensing driving circuit 500, and the power supply 800. The controller 900 can receive an input control signal CTL and input image data DATA from an image source, such as an external graphic device. The input control signal CTL can include a master clock signal, a vertical synchronization signal, a horizontal synchronization signal, a data enable signal, etc. In addition, the controller 900 can generate the first control signal CTL1 based on the input control signal CTL to control the scan driving circuit 200. Also, the controller 900 can generate the output image data DATA1 based on the input image data DATA and can generate the second control signal CTL2 based on the input control signal CTL to control the data driving circuit 300. The controller 900 can generate the third control signal CTL3 based on the input control signal CTL to control the emission driving circuit 400. The controller 900 can generate the fourth control signal CTL4 based on the input control signal CTL to control the sensing driving circuit 500.

In some embodiments, the controller 900 measures a magnitude of the characteristic change for the pixels PX. For example, the sensing driving circuit 500 outputs at least one of the sensing signals to at least one of the sensing lines in the sensing period. The controller 900 can measure a magnitude of the characteristic change for at least one of the pixels to which the sensing signals are applied in the sensing period. The controller 900 can compensate input image data DATA based on the characteristic change to reduce a characteristic variation of the pixels PX. For example, the controller 900 stores the magnitude of the characteristic change for the pixels PX in the memory device and compensate input image data DATA based on the magnitude of the characteristic change stored in the memory device.

Therefore, the sensing driving circuit 500 can selectively output the sensing signals without an additional decoder, thereby having a relatively simple structure. The sensing driving circuit 500 can receive input signals of which number is relatively small in comparison with a driving circuit including the decoder. Also, in some embodiments, the sensing driving circuit 500 does not include a part in which a static current flows. Therefore, the display device 1000 can reduce power consumption and manufacturing cost by including the sensing driving circuit 500. Also, the display device 1000 can have a narrow bezel because the sensing driving circuit 500 is implemented in a small scale.

Figure 2:
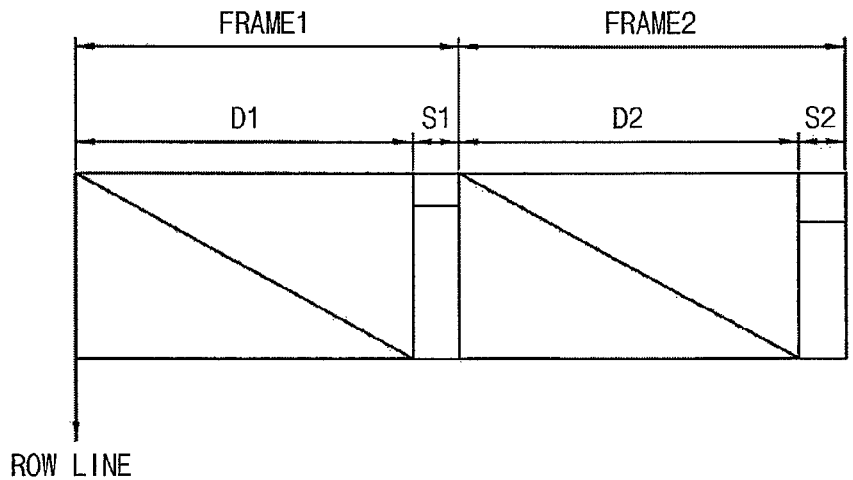
FIG. 2 is a diagram illustrating an example of frame periods for the display device of FIG. 1.

FIG. 2 is a diagram illustrating an example of frame periods for a display device of FIG. 1.

Referring to FIG. 2, each frame period FRAME1, FRAME2 includes a display period D1, D2 and a sensing period S1, S2.

In some embodiments, the display device is driven by a progressive emission technique. In order that the display device displays an image using the progressive emission technique, a scan driving circuit can sequentially provide scan signals to scan lines, and each pixel can emit light corresponding to the scan signals in the display period D1, D2. In some embodiments, the display device is driven by a simultaneous emission technique, substantially simultaneous emission technique, or concurrent emission technique. For example, the display period D1, D2 includes an initialization period, a scan period, and an emission period. In order that the display device displays the image using the simultaneous emission technique, the scan driving circuit can sequentially provide the scan signals to the scan lines in the scan period, and each pixel can emit light in the emission period.

The sensing driving circuit can output at least one of the sensing signals to at least one of the sensing lines in the sensing period S1, S2. The sensing period S1, S2 is for measuring a magnitude of the characteristic change for at least one of the pixels. In order that the display device normally displays an image, a time length of the sensing period S1, S2 can be relatively short in comparison with a time length of the display period D1, D2. Thus, the sensing signal can be applied to at least one selected from the sensing lines in each sensing period S1, S2. In some embodiments, the sensing lines are sequentially selected in every frame period. In some embodiments, the sensing lines are randomly selected.

For example, the sensing driving circuit outputs the sensing signal to the (X)th sensing line located in the (X)th row in the first sensing period S1 of the first frame period FRAME1. The controller can measure a characteristic change for the pixels connected to the (X)th sensing line in the first sensing period S1 and can store the characteristic change in a memory device. The sensing driving circuit can output the sensing signal to the (Y)th sensing line located in the (Y)th row in the second sensing period S2 of the second frame period FRAME2. The controller can measure a characteristic change for the pixels connected to the (Y)th sensing line in the second sensing period S2 and can store the characteristic change in a memory device.

Therefore, the controller can compensate input image data based on the characteristic change, thereby reducing the characteristic variation of the pixels.

Figure 3:
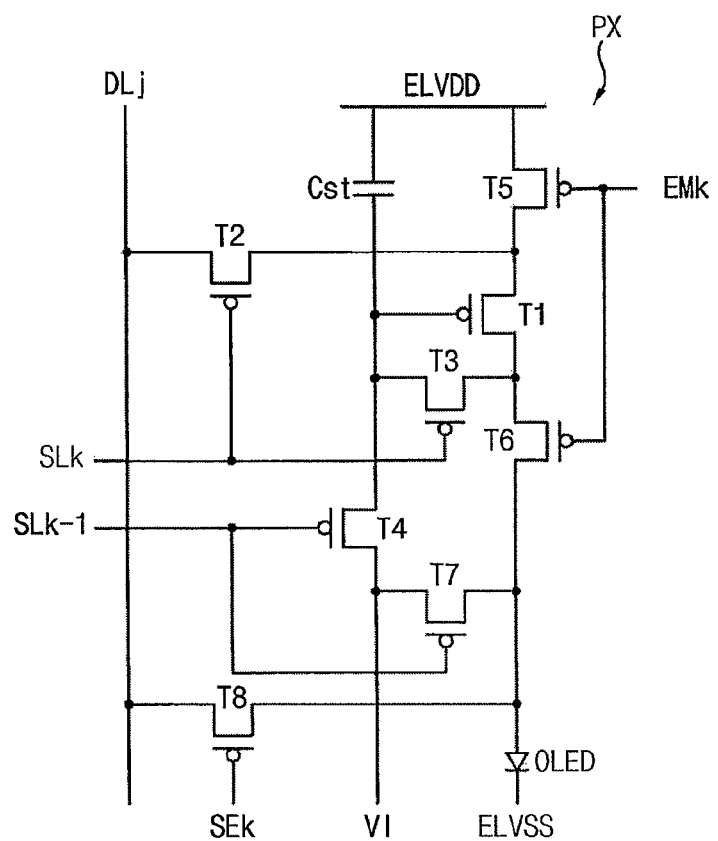
FIG. 3 is a circuit diagram illustrating an example of a pixel included in the display device of FIG. 1.

FIG. 3 is a circuit diagram illustrating an example of a pixel included in a display device of FIG. 1.

Referring to FIG. 3, at least one of the sensing lines receives the sensing signal in the sensing period. A characteristic change for the pixels PX connected to the sensing lines that receive the sensing signal can be measured.

The pixel PX can include a plurality of transistors T1 through T8 and a capacitor Cst. For example, a first transistor T1 is connected between a high power voltage ELVDD and an anode electrode of the OLED. The first transistor T1 can apply a driving current corresponding to a data signal to the OLED. A second transistor T2 can be connected between a first electrode of the first transistor T1 and a data line DLj. A third transistor T3 can be connected between a gate electrode and a second electrode of the first transistor T1. A fourth transistor T4 can be connected between an initialization voltage VI and the gate electrode of the first transistor T1. A fifth transistor T5 can be connected between the high power voltage ELVDD and the first electrode of the first transistor T1. A sixth transistor T6 can be connected between the second electrode of the first transistor T1 and the anode electrode of the OLED. A seventh transistor T7 can be connected between the initialization voltage VI and the anode electrode of the OLED. An eighth transistor T8 can be connected between the data line DLj and the anode electrode of the OLED.

For example, the fourth transistor T4 applies the initialization voltage VI to the capacitor Cst and the gate electrode of the first transistor T1 in response to the (K−1)th scan signal so as to reset the capacitor Cst and the gate electrode of the first transistor T1 as the initialization voltage VI. The seventh transistor T7 can apply the initialization voltage VI to the anode electrode of the OLED in response to the (K−1)th scan signal to reset the anode electrode of the OLED as the initialization voltage VI.

The second transistor T2 can apply the data signal to the first transistor T1 in response to the (K)th scan signal.

The third transistor T3 can compensate a threshold voltage of the first transistor T1 in response to the (K)th scan signal by connecting the gate electrode and the second electrode of the first transistor T1 (i.e., a diode connection of the first transistor T1). Because the second transistor T2 and the third transistor T3 can receive the (K)th scan signal, the data signal can be applied while the threshold voltage of the first transistor T1 is compensated.

The first transistor T1 can provide the driving current corresponding to the data signal to the OLED.

The sixth transistor T6 can be located between the second electrode of the first transistor T1 and the anode electrode of the OLED. The sixth transistor T6 can control light emission of the OLED in response to a (K)th emission signal.

The eighth transistor T8 can connect the anode electrode of the OLED to the data line DLj in response to the (K)th sensing signal to measure the characteristic change of the pixel PX.

Figure 4:
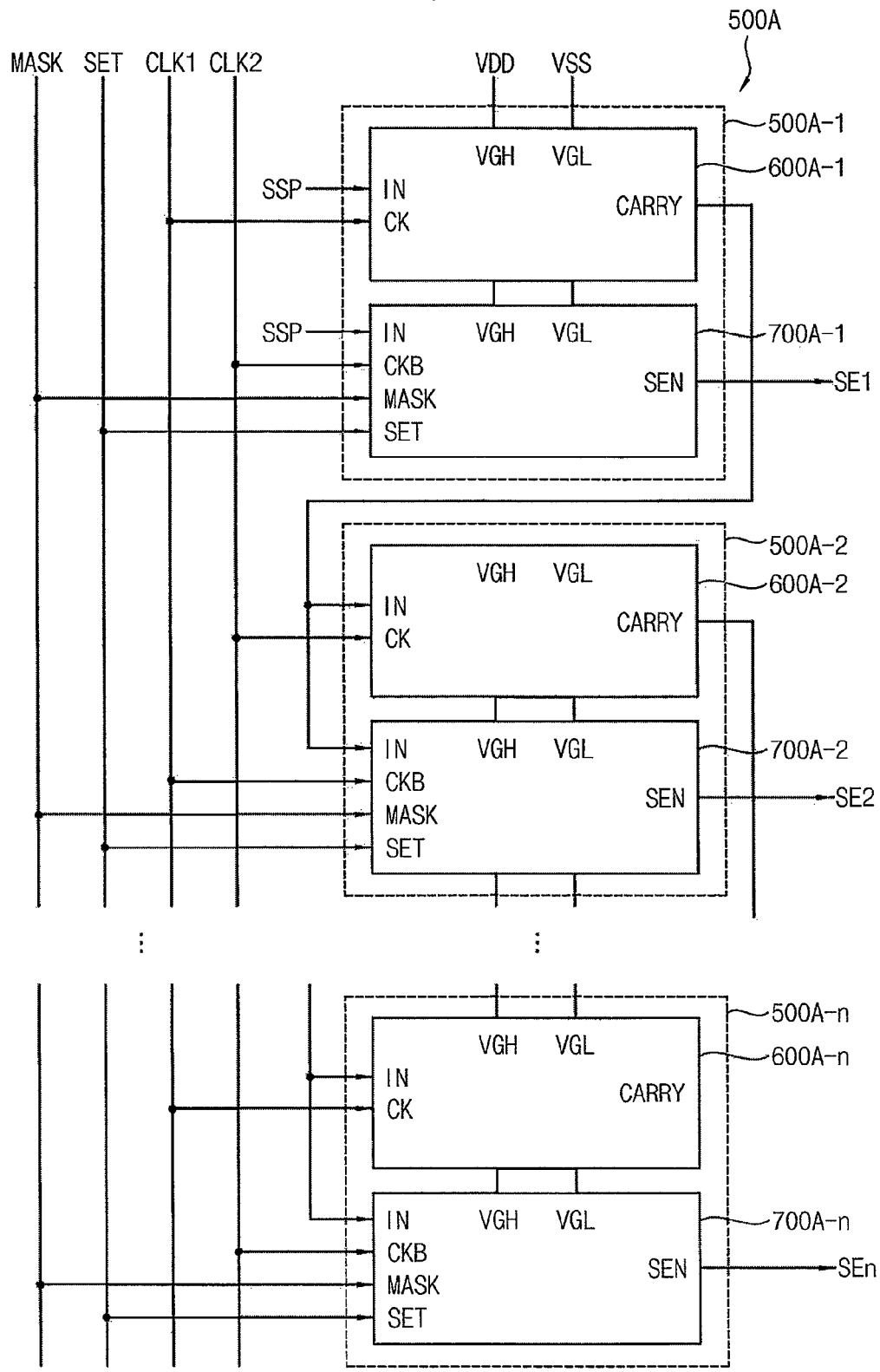
FIG. 4 is a block diagram illustrating one example of a sensing driving circuit included in the display device of FIG. 1.

FIG. 4 is a block diagram illustrating one example of a sensing driving circuit included in a display device of FIG. 1.

Referring to FIG. 4, the sensing driving circuit 500A includes a plurality of stages 500A-1 through 500A-n that are dependently connected to each other. Each of the stages 500A-1 through 500A-n can include a shift register unit and a masking buffer unit. Each of the shift register units 600A-1 through 600A-n can include an input terminal IN, a second clock terminal CK, a first voltage terminal VGH, a second voltage terminal VGL, and a carry signal output terminal CARRY. Each of the masking buffer units 700A-1 through 700A-n can include an input terminal IN, a first clock terminal CKB, a masking terminal MASK, a node driving terminal SET, a first voltage terminal VGH, a second voltage terminal VGL, and a sensing signal output terminal SEN.

An input signal can be applied to the input terminal IN. Here, the input signal can be a sensing start signal SSP or a carry signal of the previous stage. Thus, the sensing start signal SSP is applied to the input terminal IN of the first stage 500A-1. The carry signals of the previous stages are respectively applied to each input terminal IN of the second through (N)th stages 500A-2 through 500A-n.

A first sensing clock signal CLK1 or a second sensing clock signal CLK2 having different timings can be applied to the first clock terminal CKB. For example, the second sensing clock signal CLK2 is a signal inverted from the first sensing clock signal CLK1. In adjacent stages, the first sensing clock signal CLK1 and the second sensing clock signal CLK2 can be applied to the first clock terminal CKB in opposite sequences. For example, the second sensing clock signal CLK2 is applied to the first clock terminal CKB of odd-numbered stages 500A-1, 500A-3, . . . In contrast, in this example, the first sensing clock signal CLK1 is applied to the first clock terminal CKB of even-numbered stages 500A-2, 500A-4, . . .

A first sensing clock signal CLK1 or a second sensing clock signal CLK2 having different timings can be applied to the second clock terminal CK. In adjacent stages, the first sensing clock signal CLK1 and the second sensing clock signal CLK2 can be applied to the second clock terminal CK in opposite sequences. For example, the first sensing clock signal CLK1 is applied to the second clock terminal CK of odd-numbered stages 500A-1, 500A-3, . . . In contrast, in this example, the second sensing clock signal CLK2 is applied to the second clock terminal CK of even-numbered stages 500A-2, 500A-4, . . .

A node driving signal can be applied to the node driving terminal SET. The node driving signal is for controlling the first node and the second node of the masking buffer unit. For example, the node driving signal is applied to the node driving terminal SET at a start point of the sensing period.

A masking signal can be applied to the masking terminal MASK. The masking signal is for masking the first node and the second node of the masking buffer unit. For example, the masking signal is inactivated at the start point of the sensing period.

A first voltage VDD can be provided to the first voltage terminal VGH. For example, the first voltage VDD is a high level voltage.

A second voltage VSS can be provided to the second voltage terminal VGL. For example, the second voltage VSS is a low level voltage.

A carry signal can be outputted to an input terminal IN of the next stage via the carry signal output terminal CARRY. For example, the first carry signal is outputted to the input terminal IN of the second stage 500A-2 via the carry signal output terminal CARRY of the first stage 500A-1.

A sensing signal can be outputted to a sensing line via the sensing signal output terminal SEN. For example, the sensing start signal SSP is adjusted to select some of the sensing lines for measuring the characteristic change or the deterioration of the pixel in the sensing period. Therefore, the sensing signals can be outputted by aimed stages in the sensing period by controlling the masking signal and the node driving signal.

Figure 5:
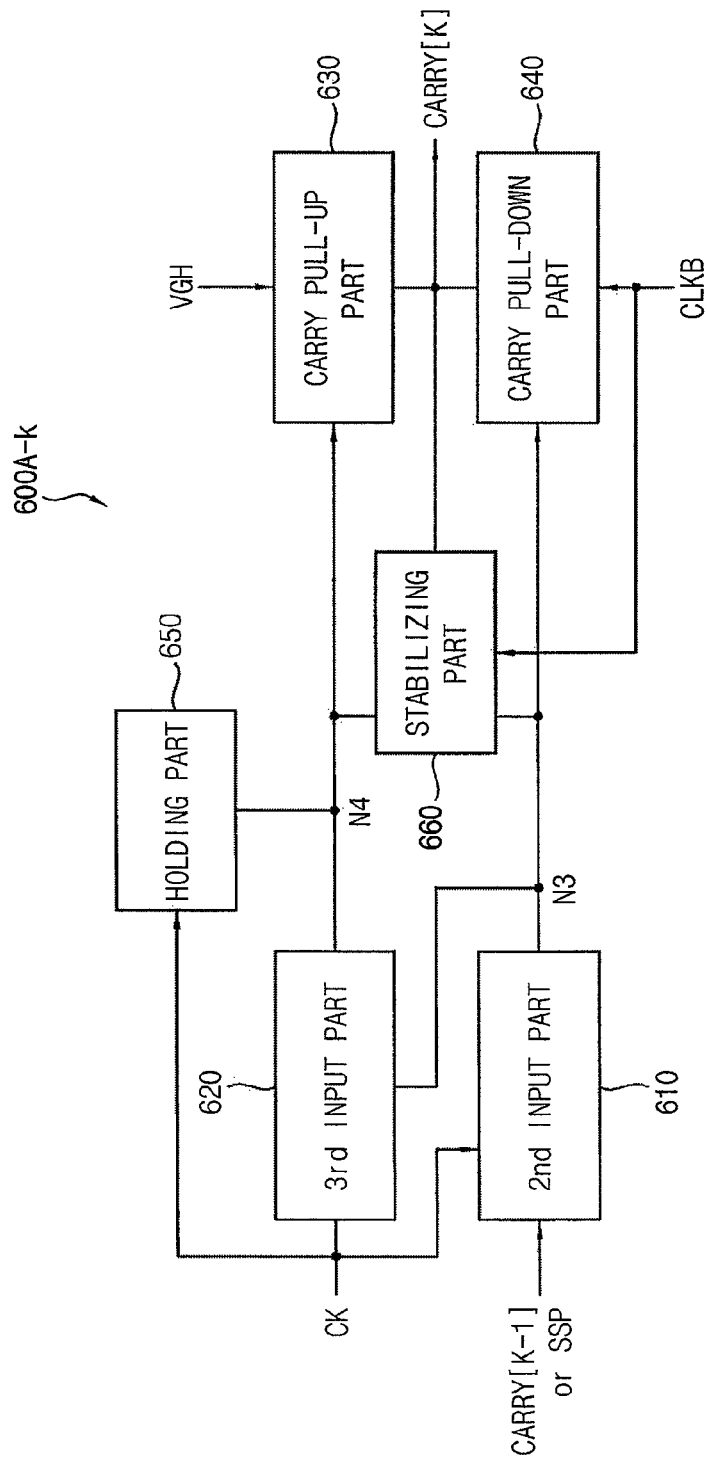
FIG. 5 is a block diagram illustrating a shift register unit of a (K)th stage included in the sensing driving circuit of FIG. 4.
Figure 6:
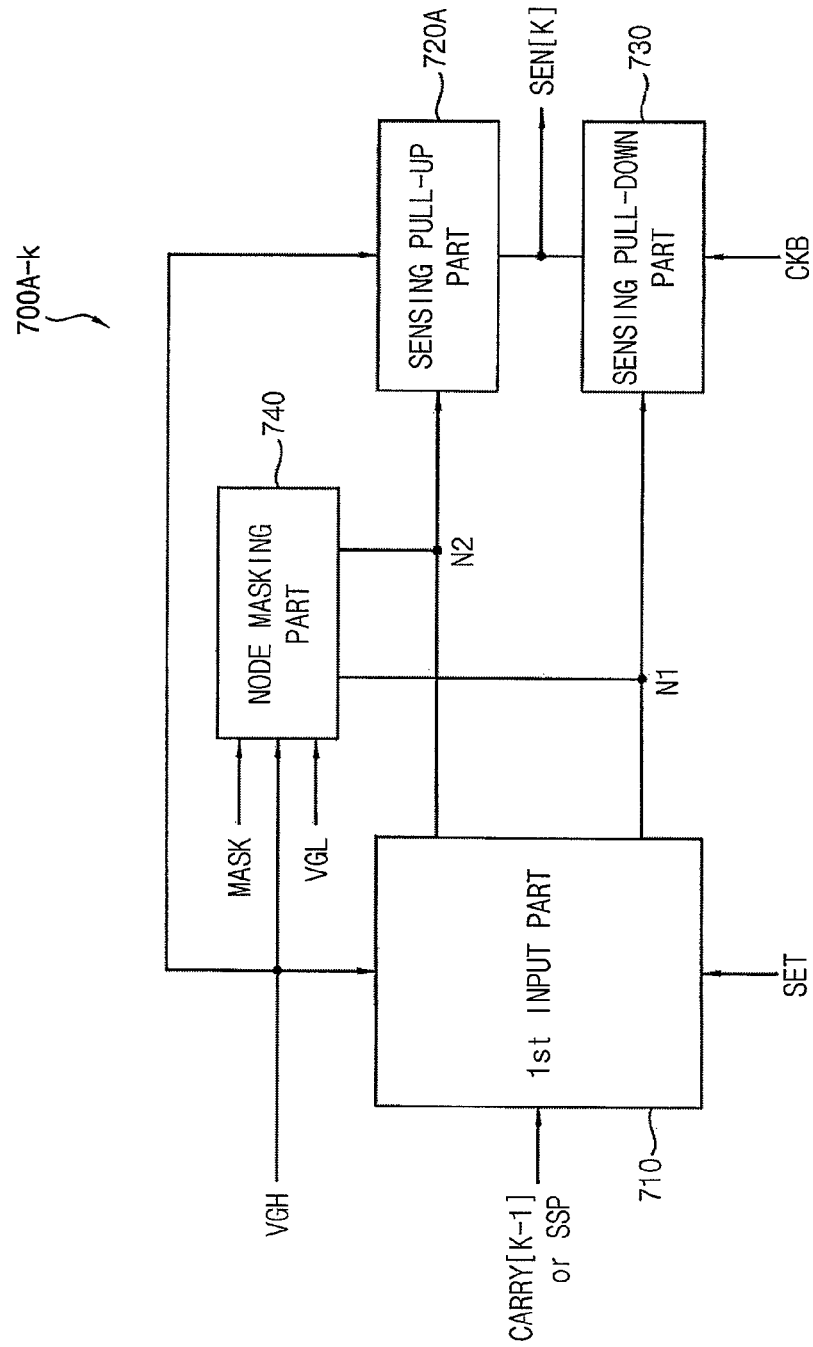
FIG. 6 is a block diagram illustrating a masking buffer unit of a (K)th stage included in the sensing driving circuit of FIG. 4.
Figure 7:
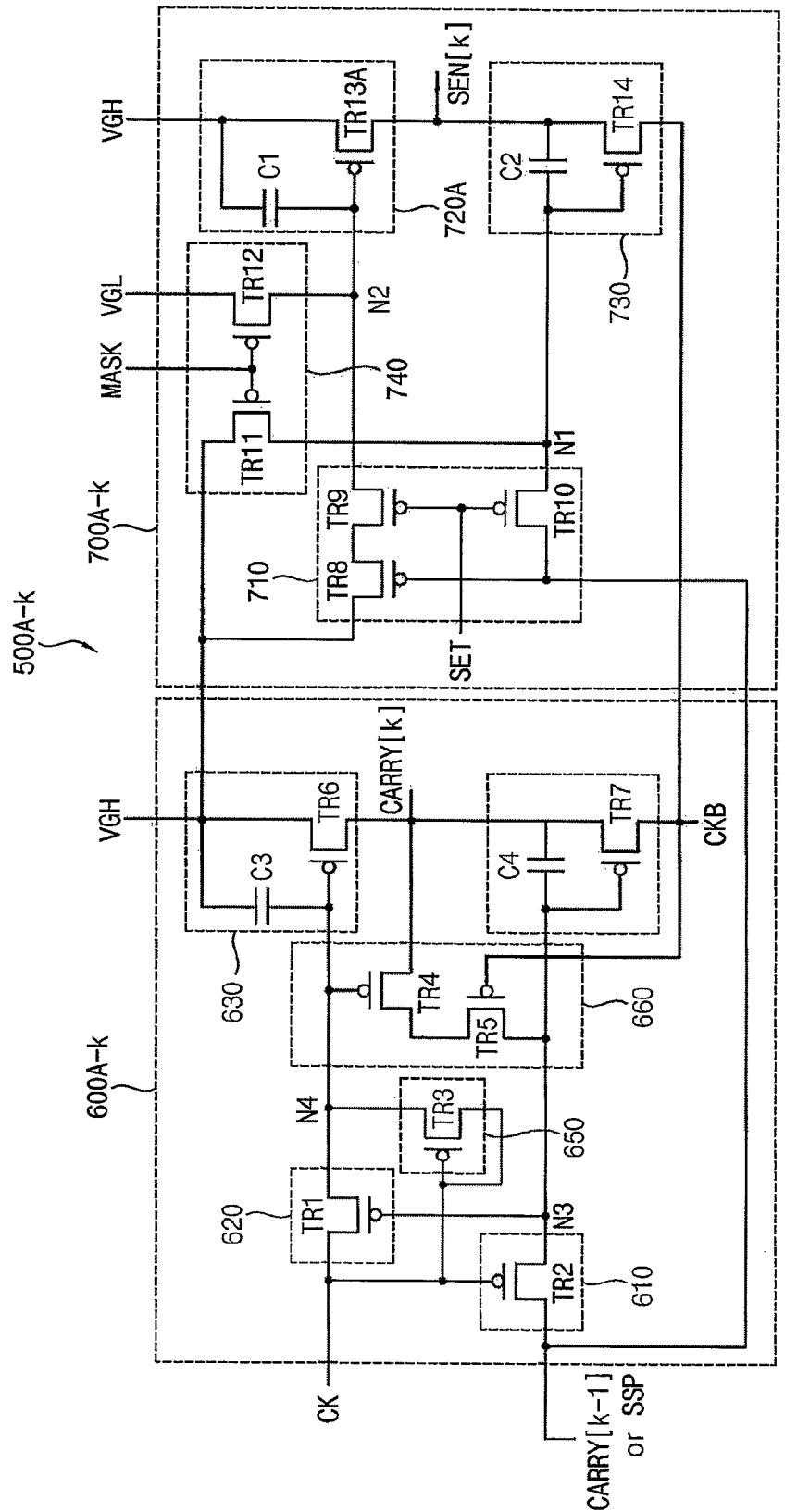
FIG. 7 is a circuit diagram illustrating a (K)th stage included in the sensing driving circuit of FIG. 4.

FIG. 5 is a block diagram illustrating a shift register unit of a (K)th stage included in a sensing driving circuit of FIG. 4. FIG. 6 is a block diagram illustrating a masking buffer unit of a (K)th stage included in a sensing driving circuit of FIG. 4. FIG. 7 is a circuit diagram illustrating a (K)th stage included in a sensing driving circuit of FIG. 4.

Referring to FIGS. 5 through 7, the (K)th stage 500A-k included in the sensing driving circuit includes a shift register unit or shift register 600A-k and a masking buffer unit or masking buffer 700A-k.

The shift register unit 600A-k can provide a (K)th carry signal CARRY[K] to a next stage of the (K)th stage 500A-k. The shift register unit 600A-k can include a second input part 610, a third input part 620, a carry pull-up part 630, a carry pull-down part 640, a holding part 650, and a stabilizing part 660.

The second input part 610 can apply the input signal to a third node N3 in response to the second clock signal CK. Thus, the second input part 610 can apply the sensing start signal SSP or the carry signal of previous stage CARRY [K−1] to the third node N3 in response to the second clock signal CK. In some embodiments, the second input part 610 includes a fourth input transistor TR2. The fourth input transistor TR2 can include a gate electrode to which the second clock signal CK is applied, a first electrode to which the input signal is applied, and a second electrode connected to the third node N3.

The third input part 620 can apply the second clock signal CK to a fourth node N4 in response to a third node signal of the third node N3. In some embodiments, the third input part 620 includes a fifth input transistor TR1. The fifth input transistor TR1 can include a gate electrode to which the third node signal is applied, a first electrode to which the second clock signal CK is applied, and a second electrode connected to the fourth node N4.

The carry pull-up part 630 can pull up the (K)th carry signal CARRY[K] in response to the fourth node signal of the fourth node N4. For example, the carry pull-up part 630 controls the (K)th carry signal CARRY[K] as the first logic level in response to the fourth node signal. In some embodiments, the carry pull-up part 630 includes a second pull-up transistor TR6 and a third capacitor C3. The second pull-up transistor TR6 can include a gate electrode connected to the fourth node N4, a first electrode to which the first power voltage VGH is applied, and a second electrode connected to a carry signal output terminal outputting the (K)th carry signal CARRY[K]. The third capacitor C3 can include a first electrode connected to the fourth node N4, and a second electrode to which the first power voltage VGH is applied.

The carry pull-down part 640 can pull down the (K)th carry signal CARRY[K] in response to the third node signal. For example, the carry pull-down part 640 controls the (K)th carry signal CARRY[K] as the second logic level in response to the third node signal. In some embodiments, the carry pull-down part 640 includes a second pull-down transistor TR7 and a fourth capacitor C4. The second pull-down transistor TR7 can include a gate electrode connected to the third node N3, a first electrode to which a first clock signal CKB is applied, and a second electrode connected to the carry signal output terminal outputting the (K)th carry signal CARRY[K]. The fourth capacitor C4 can include a first electrode connected to the third node N3, and a second electrode connected to the carry signal output terminal.

The holding part 650 can maintain the fourth node signal in response to the second clock signal CK. In some embodiments, the holding part 650 includes a holding transistor TR3. The holding transistor TR3 can include a gate electrode to which the second clock signal CK is applied, a first electrode to which the second clock signal CK is applied, and a second electrode connected to the fourth node N4.

The stabilizing part 660 can stabilize the (K)th carry signal CARRY[K] in response to the fourth node signal and a first clock signal CKB. In some embodiments, the stabilizing part 660 includes a first stabilizing transistor TR5 and a second stabilizing transistor TR4. The first stabilizing transistor TR5 can include a gate electrode to which the first clock signal CKB is applied, a first electrode connected to the third node N3, and a second electrode connected to a first electrode of the second stabilizing transistor TR4. The second stabilizing transistor TR4 can include a gate electrode connected to the fourth node N4, the first electrode connected to the second electrode of the first stabilizing transistor TR5, and the second electrode connected to the carry signal output terminal outputting the (K)th carry signal CARRY[K].

Although the example embodiments of FIGS. 5 and 7 describe that the shift register unit 600A-k includes the second input part 610, the third input part 620, the carry pull-up part 630, the carry pull-down part 640, the holding part 650, and the stabilizing part 660, the shift register unit can have a variety of structures that can sequentially output the carry signals.

The masking buffer unit 700A-k can output a (K)th sensing signal SEN[K]. Thus, the sensing driving circuit can output the sensing signal SEN[K] to the (K)th sensing line using the masking buffer unit 700A-k in the sensing period when the (K)th sensing line is selected by controller. The masking buffer unit 700A-k can include a first input part 710, a sensing pull-up part 720A, a sensing pull-down part 730, and a node masking part 740.

The first input part 710 can apply the input signal (i.e., the sensing start signal SSP or the carry signal of previous stage CARRY[K−1]) to a first node N1 in response to a node driving signal SET and can apply a first power voltage VGH to a second node N2 in response to the input signal and the node driving signal SET. In some embodiments, the first input part 710 includes a first input transistor TR8, a second input transistor TR9, and a third input transistor TR10. The first input transistor TR8 can include a gate electrode to which the input signal is applied, a first electrode to which the first power voltage VGH is applied, and a second electrode connected to a first electrode of the second input transistor TR9. The second input transistor TR9 can include a gate electrode to which the node driving signal SET is applied, the first electrode connected to the second electrode of the first input transistor TR8, and a second electrode connected to the second node N2. The third input transistor TR10 can include a gate electrode to which the node driving signal SET is applied, a first electrode to which the input signal is applied, and a second electrode connected to the first node N1. Therefore, when the node driving signal SET is applied to the first input part 710, the first input part 710 can apply the input signal to the first node N1 to output the (K)th sensing signal SEN[K].

The sensing pull-up part 720A can pull up the (K)th sensing signal SEN[K] in response to a second node signal of the second node N2. In some embodiments, the sensing pull-up part 720A includes a first full-up transistor TR13A and a first capacitor C1. The first full-up transistor TR13A can include a gate electrode connected to the second node N2, a first electrode to which the first power voltage VGH is applied, and a second electrode connected to a sensing signal output terminal outputting the (K)th sensing signal SEN[K]. The first capacitor C1 can include a first electrode connected to the second node N2, and a second electrode to which the first power voltage VGH is applied.

The sensing pull-down part 730 can pull down the (K)th sensing signal SEN[K] in response to a first node signal of the first node N1. In some embodiments, the sensing pull-down part 730 includes a first full-down transistor TR14 and a second capacitor C2. The first full-down transistor TR14 can include a gate electrode connected to the first node N1, a first electrode to which a first clock signal CKB is applied, and a second electrode a sensing signal output terminal outputting the (K)th sensing signal SEN[K]. The second capacitor C2 can include a first electrode connected to the first node N1, and a second electrode connected to the sensing signal output terminal.

The node masking part 740 can apply the first power voltage VGH to the first node N1 in response to a masking signal MASK, and can apply a second power voltage VGL to the second node N2 in response to the masking signal MASK. In some embodiments, the node masking part 740 includes a first masking transistor TR11 and a second masking transistor TR12. The first masking transistor TR11 can include a gate electrode to which the masking signal MASK is applied, a first electrode to which the first power voltage VGH applied, and a second electrode connected to the first node N1. The second masking transistor TR12 can include a gate electrode to which the masking signal MASK applied, a first electrode to which a second power voltage VGL is applied, and a second electrode connected to the second node N2. Therefore, when the masking signal MASK is applied to the node masking part 740, the node masking part 740 can activate the sensing pull-up part 720A and can inactivate the sensing pull-down part 730.

Figure 8:
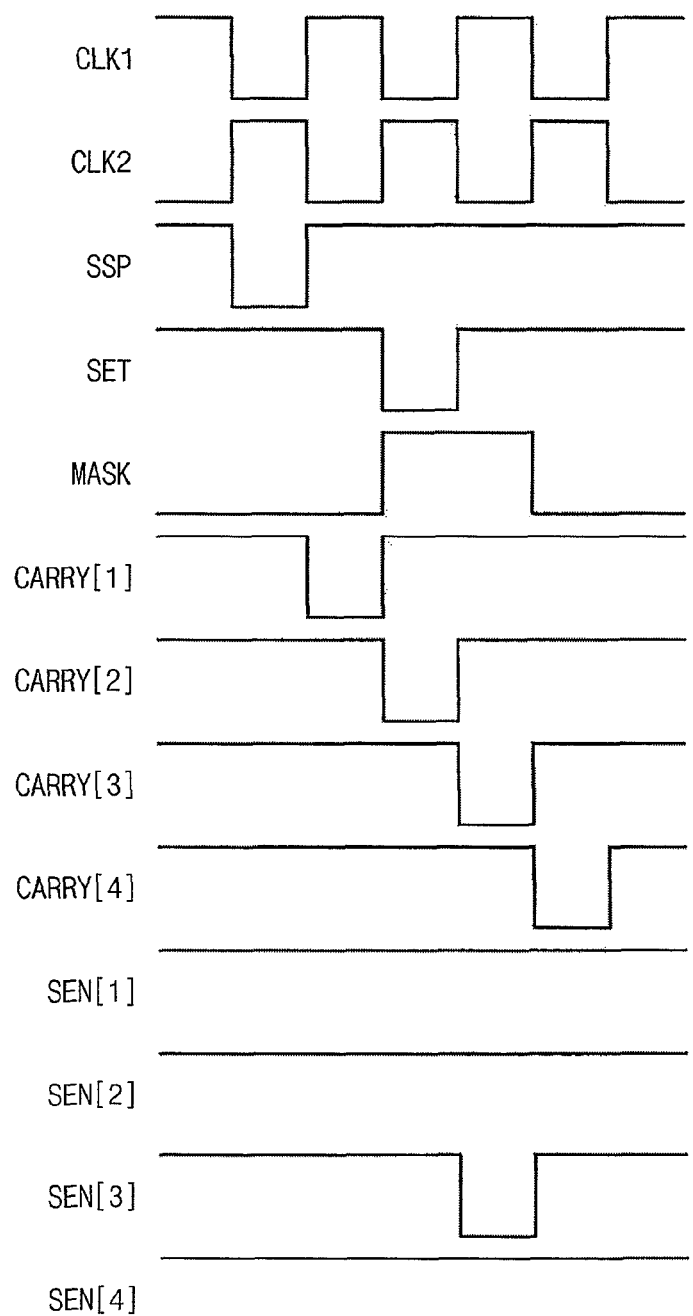
FIG. 8 is a waveform diagram for describing a sensing operation of the sensing driving circuit of FIG. 4.

FIG. 8 is a waveform diagram for describing a sensing operation of a sensing driving circuit of FIG. 4.

Referring to FIG. 8, the display device controls a sensing start signal SSP, a masking signal MASK, and a node driving signal SET to output the sensing signal to at least one of the sensing lines in the sensing period.

For example, the third sensing signal SEN[3] is outputted to the third sensing line in the sensing period to measure a characteristic change of the pixels connected to the third sensing line. To output the third sensing signal SEN[3] in the sensing period, a timing of the sensing start signal SSP can be adjusted. The sensing start signal SSP can be applied to the sensing driving circuit. Each stage in the sensing driving circuit can sequentially provide the carry signal to next stage. To activate the third sensing signal SEN[3], the masking signal MASK is inactivated and the node driving signal SET is activated at a point in which the second carry signal CARRY[2] is activated. Therefore, the masking buffer unit of the third stage can receive the second carry signal CARRY[2] and can output the third sensing signal SEN[3] in the sensing period by controlling the masking signal MASK and the node driving signal SET.

Figure 9:
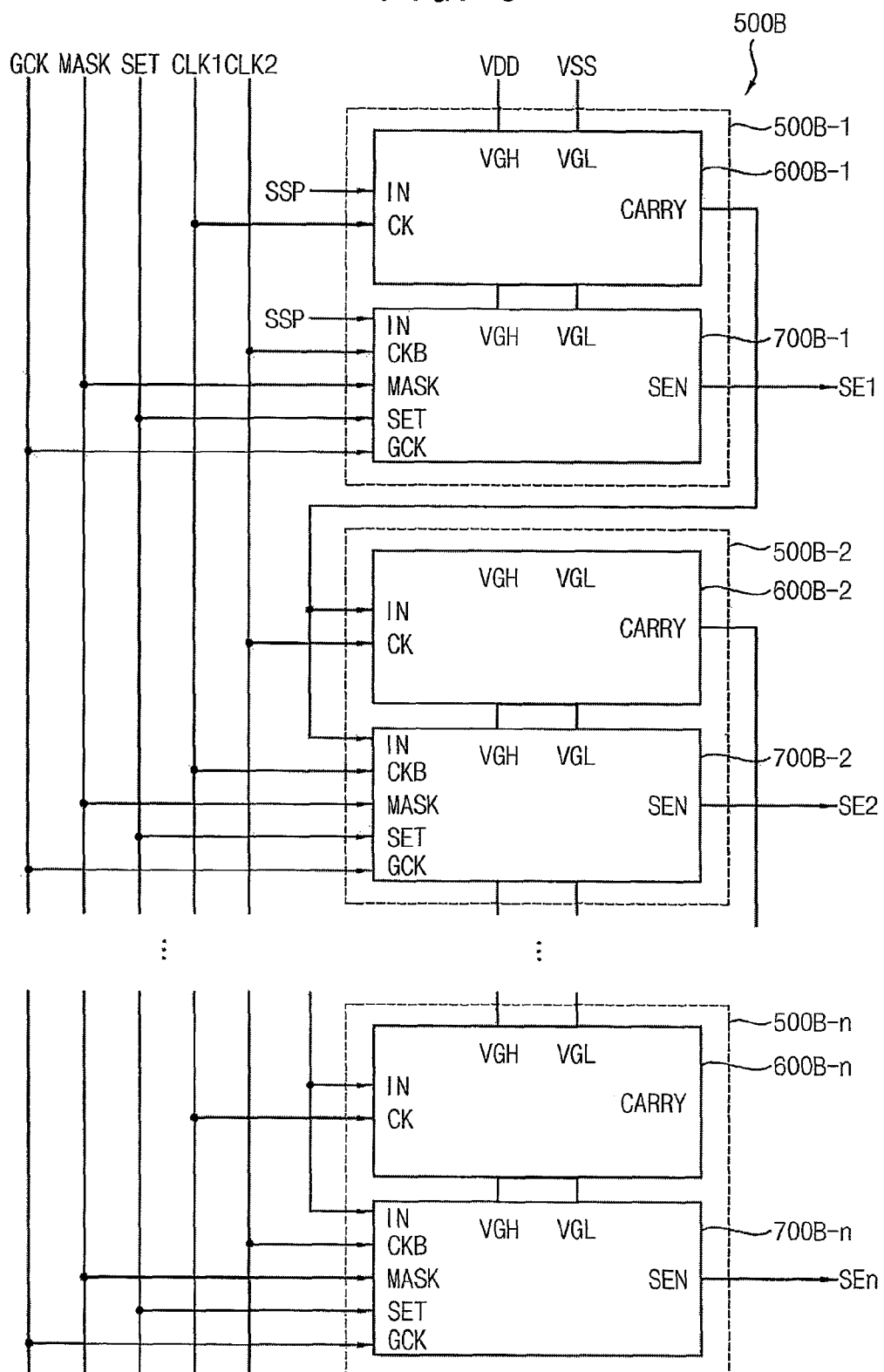
FIG. 9 is a block diagram illustrating another example of the sensing driving circuit included in a display device of FIG. 1.

FIG. 9 is a block diagram illustrating another example of a sensing driving circuit included in a display device of FIG. 1.

Referring to FIG. 9, the sensing driving circuit 500B includes a plurality of stages 500B-1 through 500B-n that are electrically connected to each other. Each of the stages 500B-1 through 500B-n can include a shift register unit and a masking buffer unit. The sensing driving circuit 500B according to the present exemplary embodiment is substantially the same as the sensing driving circuit of the exemplary embodiment described in FIG. 4, except that a substantially simultaneous driving terminal or concurrent driving terminal GCK receiving a substantially simultaneous or concurrent driving signal or global driving signal is added. Therefore, the same reference numerals will be used to refer to the same or like parts as those described in the previous exemplary embodiment of FIG. 4, and any repetitive explanation concerning the above elements will be omitted.

Each of the shift register units 600B-1 through 600B-n can include an input terminal IN, a second clock terminal CK, a first voltage terminal VGH, a second voltage terminal VGL, and a carry signal output terminal CARRY.

Each of the masking buffer units 700B-1 through 700B-n can include an input terminal IN, a first clock terminal CKB, a masking terminal MASK, a node driving terminal SET, a first voltage terminal VGH, a second voltage terminal VGL, a sensing signal output terminal SEN, and a simultaneous driving terminal GCK.

A simultaneous driving signal is for outputting the sensing signals that have substantially the same phase to the sensing lines. The simultaneous driving signal can be applied to the simultaneous driving terminal GCK. For example, the simultaneous driving signal is applied to the simultaneous driving terminal GCK in an initialization period of the display panel.

Figure 10:
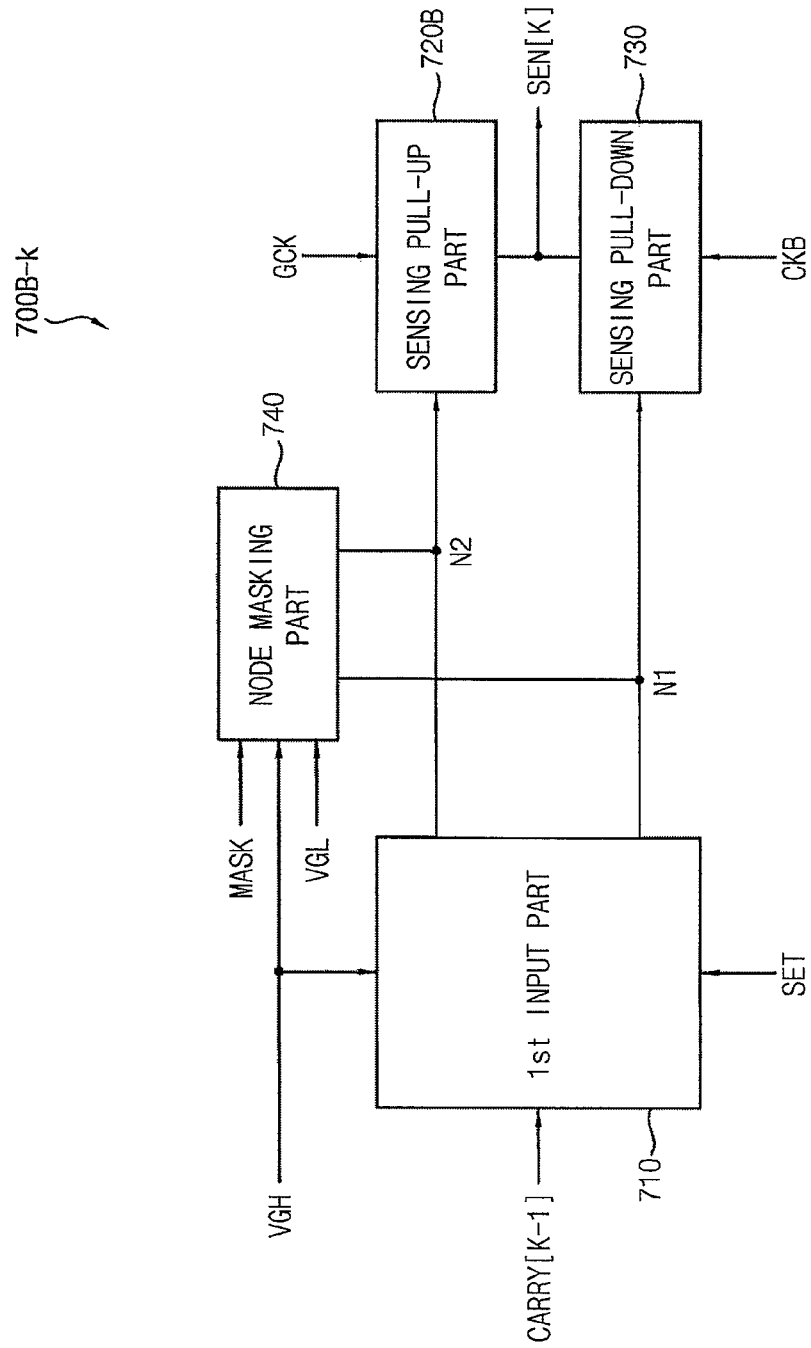
FIG. 10 is a block diagram illustrating a masking buffer unit of a (K)th stage included in the sensing driving circuit of FIG. 9.
Figure 11:
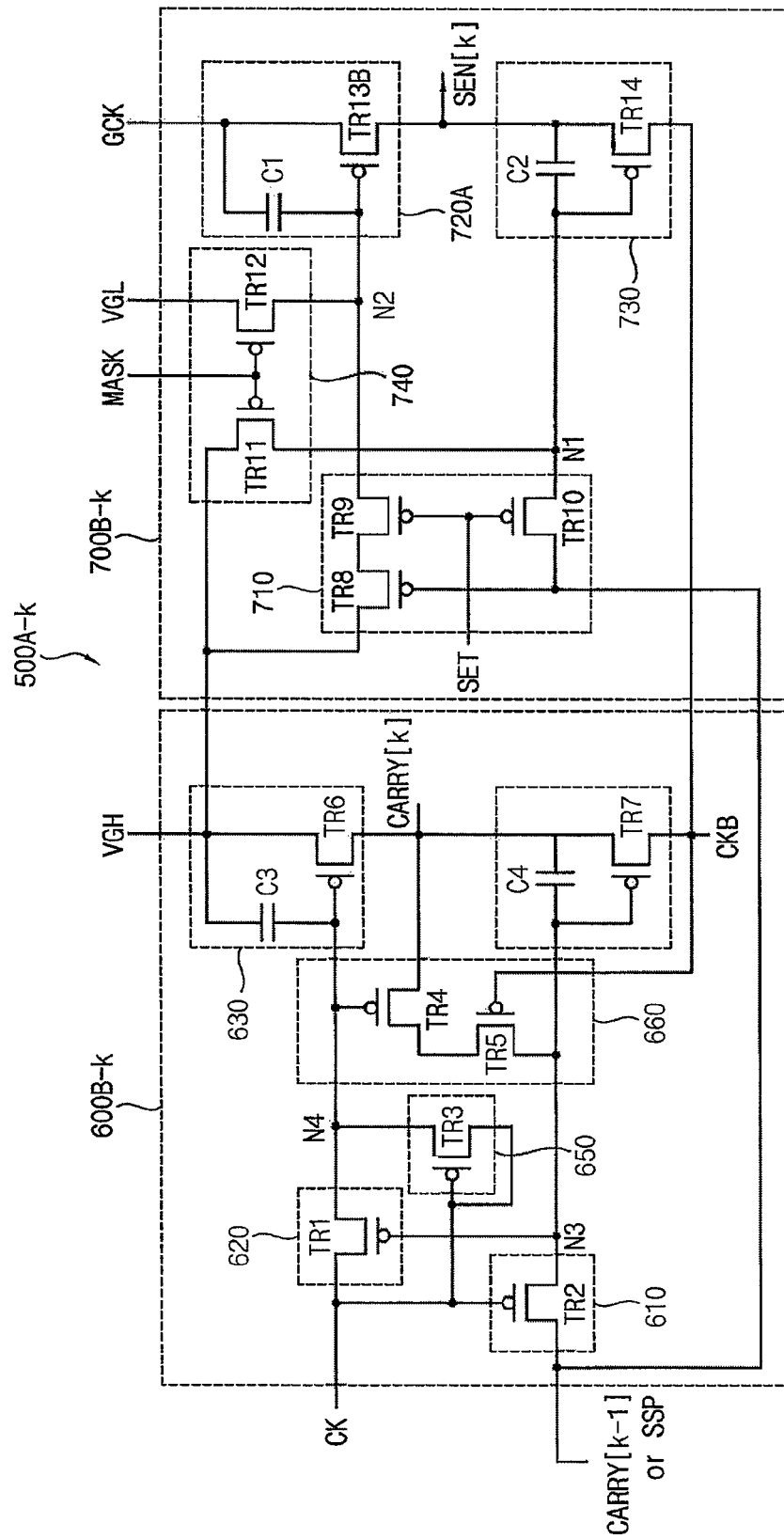
FIG. 11 is a circuit diagram illustrating a (K)th stage included in the sensing driving circuit of FIG. 9.

FIG. 10 is a block diagram illustrating a masking buffer unit of a (K)th stage included in a sensing driving circuit of FIG. 9. FIG. 11 is a circuit diagram illustrating a (K)th stage included in a sensing driving circuit of FIG. 9.

Referring to FIGS. 10 and 11, the (K)th stage 500B-k included in the sensing driving circuit includes a shift register unit 600B-k and a masking buffer unit 700B-k.

The shift register unit 600B-k can provide a (K)th carry signal CARRY[K] to a next stage of the (K)th stage 500B-k. The shift register unit 600B-k can include a second input part 610, a third input part 620, a carry pull-up part 630, a carry pull-down part 640, a holding part 650, and a stabilizing part 660. The shift register unit 600B-k according to the present exemplary embodiment is substantially the same as the shift register unit of the exemplary embodiment described in FIGS. 5 and 7. Therefore, the same reference numerals will be used to refer to the same or like parts as those described in the previous exemplary embodiment of FIGS. 5 and 7, and any repetitive explanation concerning the above elements will be omitted.

The masking buffer unit 700B-k can output a (K)th sensing signal SEN[K]. Thus, the sensing driving circuit can output the sensing signal SEN[K] to the (K)th sensing line using the masking buffer unit 700B-k in the sensing period when the (K)th sensing line is selected by controller. The masking buffer unit 700B-k can include a first input part 710, a sensing pull-up part 720B, a sensing pull-down part 730, and a node masking part 740. The masking buffer unit 700B-k according to the present exemplary embodiment is substantially the same as the masking buffer unit of the exemplary embodiment described in FIGS. 6 and 7, except that the sensing pull-up part 720B receives a substantially simultaneous driving signal GCK instead of a first power voltage VGH. Therefore, the same reference numerals will be used to refer to the same or like parts as those described in the previous exemplary embodiment of FIGS. 6 and 7, and any repetitive explanation concerning the above elements will be omitted.

The sensing pull-up part 720B can pull up the (K)th sensing signal SEN[K] in response to a second node signal of the second node N2. In some embodiments, the sensing pull-up part 720B includes a first full-up transistor TR13B and a first capacitor C1. The first full-up transistor TR13B can include a gate electrode connected to the second node N2, a first electrode to which a simultaneous driving signal GCK, and a second electrode connected to a sensing signal output terminal outputting the (K)th sensing signal SEN[K]. The first capacitor C1 can include a first electrode connected to the second node N2, and a second electrode to which the simultaneous driving signal GCK is applied. When the masking signal MASK is applied to the sensing driving circuit, the sensing driving circuit can output the simultaneous driving signal GCK as the sensing signals to all of the sensing lines. Also, to output the sensing signal to at least one selected from the sensing lines in the sensing period, the simultaneous driving signal GCK can have a voltage level that is substantially the same as the first power voltage VGH in the sensing period.

Figure 12:
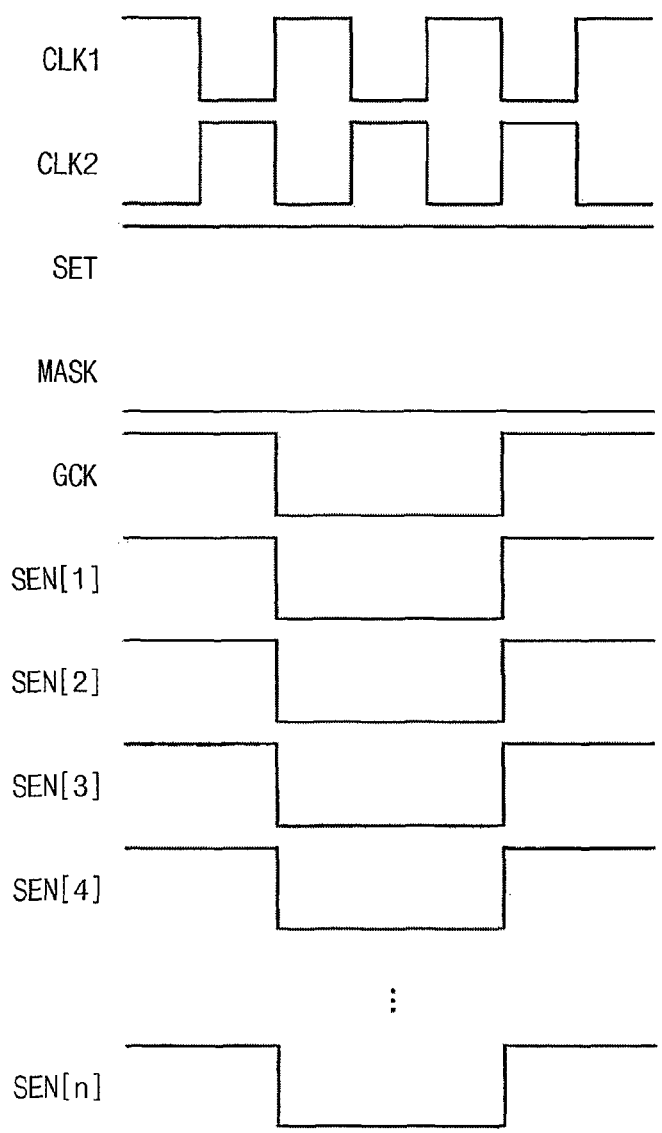
FIG. 12 is a waveform diagram for describing an initialization operation of the sensing driving circuit of FIG. 9 in an initialization period.

FIG. 12 is a waveform diagram for describing an initialization operation of a sensing driving circuit of FIG. 9 in an initialization period.

Referring to FIG. 12, the display device controls a masking signal MASK and a simultaneous driving signal GCK to output the sensing signals SEN[1] through SEN[N] that have substantially the same phase to the sensing lines in an initialization period of a display panel.

For example, to initialize the display panel in the initialization period, the sensing signals SEN[1] through SEN[N] are applied to the all of the sensing lines. For example, a node driving signal SET is inactivated and the masking signal MASK is activated in the initialization period of the display panel. The sensing pull-up part can be activated and the sensing pull-down part can be inactivated. Therefore, the sensing signals SEN[1] through SEN[N] that are substantially the same as the simultaneous driving signal GCK can be applied to the sensing lines, respectively.

Although the example embodiments describe that the sensing signal is for measuring a characteristic change of the pixel, the sensing signal is a gate signal for various purposes.

Also, although the example embodiments describe that the transistors are implemented as p-channel metal oxide semiconductor (PMOS) transistors, the transistors also can be implemented as n-channel metal oxide semiconductor (NMOS) transistors.

The described technology can be applied to an electronic device having a display device. For example, the described technology can be applied to televisions, computer monitors, laptops, cellular phones, smart phones, smart pads, personal digital assistants (PDAs), portable multimedia players (PMPs), MP3 players, navigation systems, game consoles, video phones, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive technology. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A sensing driving circuit for a display device, comprising:
    a plurality of stages configured to respectively output a plurality of sensing signals and including a (K)th stage and a (K+1)th stage, the (K)th stage comprising:
        a shift register configured to provide a (K)th carry signal to the (K+1)th stage; and
        a masking buffer configured to output a (K)th sensing signal,
        wherein the masking buffer includes:
            a first input circuit configured to provide i) an input signal to a first node based on a node driving signal and ii) a first power voltage to a second node based on the input signal and the node driving signal;
            a node masking circuit configured to simultaneously supply the first power voltage to the first node and a second power voltage to the second node based on a masking signal, wherein the second power voltage is different from the first power voltage;
            a sensing pull-up circuit configured to pull up the (K)th sensing signal based on a second node signal of the second node; and
            a sensing pull-down circuit configured to pull down the (K)th sensing signal based on a first node signal of the first node, where K is an integer greater than 0.

2. The sensing driving circuit of claim 1, wherein the first input circuit includes:
    a first input transistor including a gate electrode configured to receive the input signal, a first electrode configured to receive the first power voltage, and a second electrode;
    a second input transistor including a gate electrode configured to receive the node driving signal, a first electrode electrically connected to the second electrode of the first input transistor, and a second electrode electrically connected to the second node; and
    a third input transistor including a gate electrode configured to receive the node driving signal, a first electrode configured to receive the input signal, and a second electrode electrically connected to the first node.

3. The sensing driving circuit of claim 1, wherein the sensing pull-up circuit includes a first full-up transistor and a first capacitor.

4. The sensing driving circuit of claim 3, wherein the first full-up transistor includes a gate electrode electrically connected to the second node, a first electrode configured to receive the first power voltage, and a second electrode electrically connected to a sensing signal output terminal configured to output the (K)th sensing signal, and
    wherein the first capacitor includes a first electrode electrically connected to the second node and a second electrode configured to receive the first power voltage.

5. The sensing driving circuit of claim 3, wherein the first full-up transistor includes a gate electrode electrically connected to the second node, a first electrode configured to receive a global driving signal, and a second electrode electrically connected to a sensing signal output terminal configured to output the (K)th sensing signal, and
    wherein the first capacitor includes a first electrode electrically connected to the second node and a second electrode configured to receive the global driving signal.

6. The sensing driving circuit of claim 1, wherein the sensing pull-down circuit includes:
    a first full-down transistor including a gate electrode electrically connected to the first node, a first electrode configured to receive a first clock signal, and a second electrode electrically connected to a sensing signal output terminal configured to output the (K)th sensing signal; and
    a second capacitor including a first electrode electrically connected to the first node and a second electrode electrically connected to the sensing signal output terminal.

7. The sensing driving circuit of claim 1, wherein the shift register includes:
    a second input circuit configured to provide the input signal to a third node based on a second clock signal;
    a third input circuit configured to provide the second clock signal to a fourth node based on a third node signal of the third node;
    a carry pull-up circuit configured to pull up the (K)th carry signal based on the fourth node signal;
    a carry pull-down circuit configured to pull down the (K)th carry signal based on the third node signal;
    a holding circuit configured to maintain the fourth node signal based on the second clock signal; and a stabilizing circuit configured to stabilize the (K)th carry signal based on the fourth node signal and a first clock signal.

8. The sensing driving circuit of claim 7, wherein the second input circuit includes a fourth input transistor including a gate electrode configured to receive the second clock signal, a first electrode configured to receive the input signal, and a second electrode electrically connected to the third node.

9. The sensing driving circuit of claim 7, wherein the third input circuit includes a fifth input transistor including a gate electrode configured to receive the third node signal, a first electrode configured to receive the second clock signal, and a second electrode electrically connected to the fourth node.

10. The sensing driving circuit of claim 7, wherein the carry pull-up circuit includes:
a second pull-up transistor including a gate electrode electrically connected to the fourth node, a first electrode configured to receive the first power voltage, and a second electrode electrically connected to a carry signal output terminal configured to output the (K)th carry signal; and
a third capacitor including a first electrode electrically connected to the fourth node and a second electrode configured to receive the first power voltage.

11. The sensing driving circuit of claim 7, wherein the carry pull-down circuit includes:
a second pull-down transistor including a gate electrode electrically connected to the third node, a first electrode configured to receive a first clock signal, and a second electrode electrically connected to a carry signal output terminal configured to output the (K)th carry signal; and
a fourth capacitor including a first electrode electrically connected to the third node and a second electrode electrically connected to the carry signal output terminal.

12. The sensing driving circuit of claim 7, wherein the holding circuit includes a holding transistor including a gate electrode configured to receive the second clock signal, a first electrode configured to receive the second clock signal, and a second electrode electrically connected to the fourth node.

13. The sensing driving circuit of claim 7, wherein the stabilizing circuit includes:
a first stabilizing transistor including a gate electrode configured to receive the first clock signal, a first electrode electrically connected to the third node, and a second electrode; and
a second stabilizing transistor including a gate electrode electrically connected to the fourth node, a first electrode electrically connected to the second electrode of the first stabilizing transistor, and a second electrode electrically connected to a carry signal output terminal configured to output the (K)th carry signal.

14. A sensing driving circuit for a display device, comprising:
a plurality of stages configured to respectively output a plurality of sensing signals and including a (K)th stage and a (K+1)th stage, the (K)th stage comprising:
a shift register configured to provide a (K)th carry signal to the (K+1)th stage; and
a masking buffer configured to output a (K)th sensing signal,
wherein the masking buffer includes:
a first input circuit configured to provide i) an input signal to a first node based on a node driving signal and ii) a first power voltage to a second node based on the input signal and the node driving signal;
a node masking circuit configured to supply the first power voltage to the first node and a second power voltage to the second node based on a masking signal;
a sensing pull-up circuit configured to pull up the (K)th sensing signal based on a second node signal of the second node; and
a sensing pull-down circuit configured to pull down the (K)th sensing signal based on a first node signal of the first node, where K is an integer greater than 0,
wherein the node masking circuit includes:
a first masking transistor including a gate electrode configured to receive the masking signal, a first electrode configured to receive the first power voltage, and a second electrode electrically connected to the first node; and
a second masking transistor including a gate electrode configured to receive the masking signal, a first electrode configured to receive a second power voltage, and a second electrode electrically connected to the second node.

15. A display device comprising:
a display panel including a plurality of scan lines, a plurality of sensing lines, a plurality of data lines, and a plurality of pixels;
a data driving circuit configured to output a plurality of data signals respectively to the data lines;
a scan driving circuit configured to output a plurality of scan signals respectively to the scan lines;
a sensing driving circuit including a plurality of stages each configured to output at least one of a plurality of sensing signals to at least one of the sensing lines so as to measure a change in at least one characteristic of the pixels, wherein the stages include a (K)th stage and a (K+1)th stage; and
a controller configured to control the data driving circuit, the scan driving circuit, and the sensing driving circuit,
wherein the (K)th stage includes:
a shift register configured to provide a (K)th carry signal to the (K+1)th stage; and
a masking buffer configured to output a (K)th sensing signal, and
wherein the masking buffer includes:
a first input circuit configured to provide i) an input signal to a first node based on a node driving signal and ii) a first power voltage to a second node based on the input signal and the node driving signal;
a node masking circuit configured to supply the first power voltage to the first node based on a masking signal, and to supply a second power voltage to the second node based on the masking signal;
a sensing pull-up circuit configured to pull up the (K)th sensing signal based on a second node signal of the second node; and
a sensing pull-down circuit configured to pull down the (K)th sensing signal based on a first node signal of the first node, where K is an integer greater than 0.

16. The display device of claim 15, wherein the scan driving circuit is further configured to sequentially output the scan signals to the scan lines in a display period, and wherein the sensing driving circuit is further configured to provide the at least one sensing signal to the at least one sensing line in a sensing period.

17. The display device of claim 16, wherein the controller is further configured to measure a magnitude of the change in the characteristic of at least one of the pixels configured to receive the at least one sensing signal.

18. The display device of claim 17, wherein the controller is further configured to compensate input image data based on the change in the characteristic of the pixels so as to adjust the data signals.

19. The display device of claim 15, wherein the sensing driving circuit is further configured to output the sensing signals having the same phase to the sensing lines in an initialization period of the display panel.

20. The display device of claim 15, wherein the shift register includes:
- a second input circuit configured to provide the input signal to a third node based on a second clock signal;
- a third input circuit configured to provide the second clock signal to a fourth node based on a third node signal of the third node;
- a carry pull-up circuit configured to pull up the (K)th carry signal based on the fourth node signal;
- a carry pull-down circuit configured to pull down the (K)th carry signal based on the third node signal;
- a holding circuit configured to maintain the fourth node signal based on the second clock signal; and
- a stabilizing circuit configured to stabilize the (K)th carry signal based on the fourth node signal and a first clock signal.

* * * * *